United States Patent [19]

Hoshino et al.

[11] Patent Number: 4,614,869
[45] Date of Patent: Sep. 30, 1986

[54] APPARATUS FOR DETECTING ANGLE AND ANGULAR VELOCITY OF ROTATION MEMBER AND METHOD OF ASSEMBLING IT

[75] Inventors: Shigeru Hoshino; Hiroshi Miyata, both of Toyota, Japan

[73] Assignee: Toyota Jidosha Kabushiki Kaisha, Japan

[21] Appl. No.: 574,463

[22] Filed: Jan. 27, 1984

[30] Foreign Application Priority Data

Jan. 29, 1983 [JP] Japan ............................. 58-11958[U]

[51] Int. Cl.[4] ............................................. G01D 5/34
[52] U.S. Cl. ........................... 250/231 SE; 250/237 G
[58] Field of Search ..................... 250/231 SE, 237 G; 356/395; 340/347 P

[56] References Cited

U.S. PATENT DOCUMENTS

| | | | |
|---|---|---|---|
| 3,894,232 | 7/1975 | Laspesa | 250/231 SE |
| 4,117,320 | 9/1978 | Tomlinson et al. | 340/347 P |
| 4,297,573 | 10/1981 | Becchi et al. | 250/237 G |
| 4,317,032 | 2/1982 | Hanus et al. | 250/231 SE |
| 4,389,902 | 6/1983 | Kataoka et al. | |

Primary Examiner—David C. Nelms
Attorney, Agent, or Firm—Parkhurst & Oliff

[57] ABSTRACT

An apparatus for detecting a rotating angle and an angular velocity of a rotation member, such as a steering column mounted in a vehicle, and a method of assembling it. The apparatus has a disc secured onto an outer peripheral portion of a steering shaft, and a sensor mounted on a steering column tube. The steering column tube has a projecting form into which a luminescent element and a light receiving element are provided. The projecting form is designed not to contact with the disc.

10 Claims, 11 Drawing Figures

APPARATUS FOR DETECTING ANGLE AND ANGULAR VELOCITY OF ROTATION MEMBER AND METHOD OF ASSEMBLING IT

BACKGROUND OF THE INVENTION

The present invention relates to an apparatus for detecting an angle and an angular velocity of a rotating member and a method of assembling the same, and more particularly to a steering sensor for detecting a an angle and steering angular velocity of a steering member.

Heretofore, an apparatus for detecting a steering angle and an angular velocity of a steering member generally included a disc mounted on a steering shaft, and a sensor secured to a steering column tube. Applicant also proposed an invention relating to how to the sensor is mounted, in a separate patent application (U.S. Ser. No. 547,353). The disc is designed to be rotated with the steering shaft, and has a number of small holes which are concentrically located thereon. The sensor has a luminescent element and a light receiving element, which are oppositely located on different axial sides of the disc and are positioned such that light emitted can pass through the holes of the disc and contact the light receiving element. When the steering shaft rotates by a driver's operation, the disc is forced to rotate with the steering shaft. In this condition, the light transmitted from the luminescent element to the light receiving element is interrupted by the rotation of the disc. The degree of the interruption is proportional to the number of the rotations of the disc. The degree of the interruption is converted to an electric pulse, thereafter and the steering angle and the steering angular velocity are calculated by the electric pulse.

It is quite difficult to assemble the disc and the sensor with high accuracy. Further, there is the possibility of bending the thin disc because the thin disc might be struck with one of the luminescent or light receiving elements during assembly thereof.

SUMMARY OF THE INVENTION

The present invention was made in view of the foregoing background and to overcome the foregoing drawbacks. It is an object of this invention to provide an apparatus for detecting a steering angle and a steering angular velocity of a steering wheel of a vehicle which overcomes the above enumerated difficulties.

To attain the above objects, an apparatus according to the present invention has a disc mounted on and rotatable with a rotation member, and a sensor including a luminescent element and a light receiving element therein. The disc has a plurality of holes, which are concentrically provided thereon. The luminescent element and a light receiving element extend to a point corresponding to the hole of the disc, and each of the elements is positioned on opposite axial sides of the disc, respectively. The disc has an extending portion which projects toward the sensor. The sensor has extending portions, wherein the elements are provided. The extending portion of the sensor is designed to be longer than that of the extending portion of the disc.

The above objects, features and advantages of the present invention will become more apparent from the following description of the preferred embodiment taken in conjunction with the accompanying drawings.

DETAILED DESCRIPTION OF THE PREFERRED EMBODIMENT

The present invention is described in detail with reference to the accompanying drawings which illustrate different embodiments of the present invention.

Figure 1:
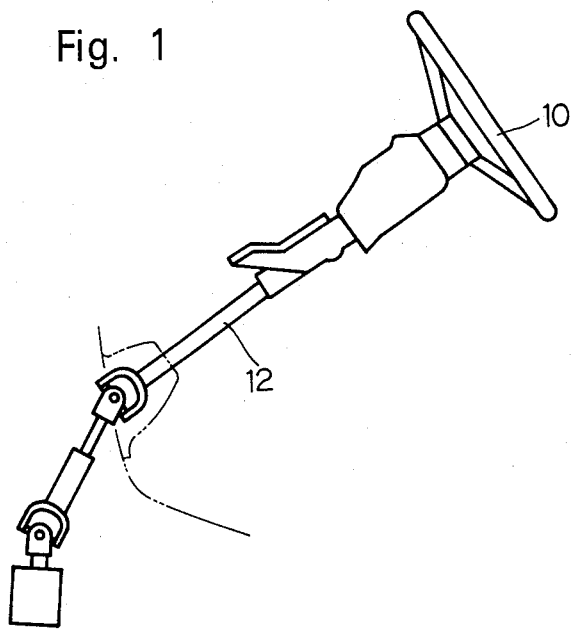
FIG. 1 is a perspective view of a steering device which can utilize an apparatus according to the present invention.
Figure 2:
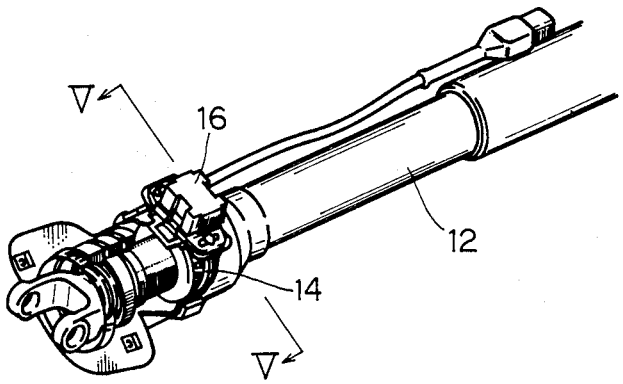
FIG. 2 is a perspective view of a steering shaft having the detecting means according to the present invention applied thereto.
Figure 3:
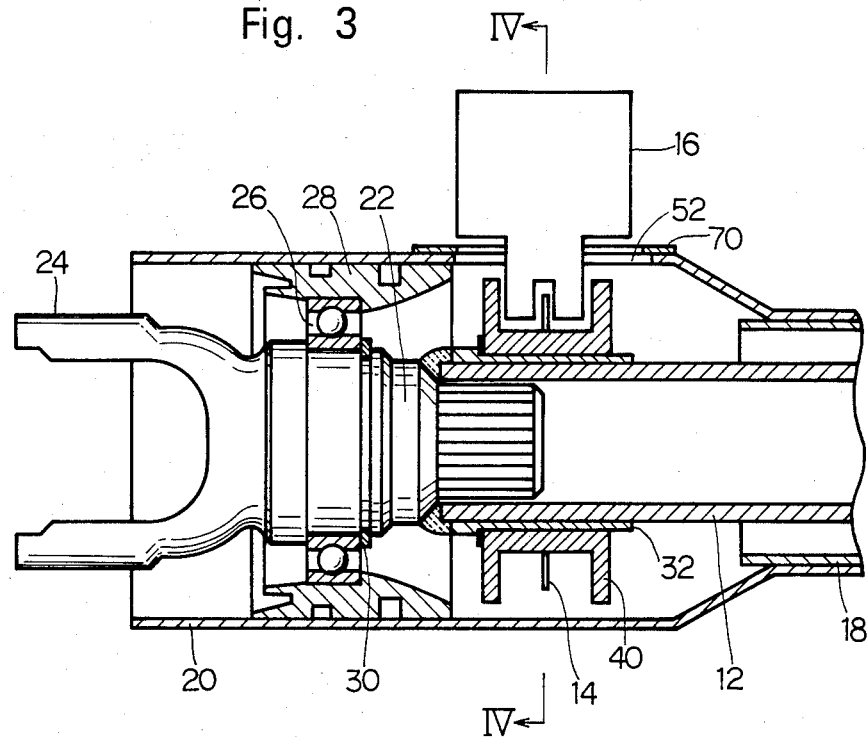
FIG. 3 is an enlarged partial cross-sectional view of the embodiment of the present invention.

FIG. 1 shows a perspective view of a steering device in which an apparatus according to the present invention is utilized. The rotational movement of a steering wheel 10 is transmitted through a steering shaft 12 to wheels (not shown in drawings). The perspective view of the steering shaft using a detecting means according to the present invention is shown in FIG. 2. A disc 14, which includes a plurality of small holes concentrically located thereon is mounted on the outer periphery of the steering shaft 12. A sensor 16 is located at the outer side of the disc 14, and secured to a steering column tube. FIG. 3 shows an enlarged detailed cross-sectional view of the apparatus according to the present invention.

Figure 4:
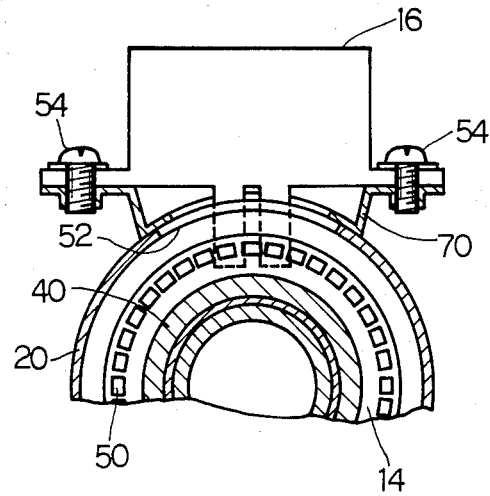
FIG. 4 is a partial cross-sectional view taken along the line IV—IV in FIG. 3.
Figure 5:
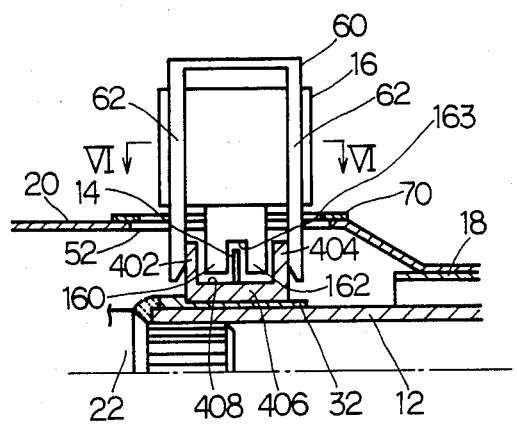
FIG. 5 is a reduced partial cross-sectional view taken along the line V—V in FIG. 2.

A steering column tube 18 extends downward (the left direction in FIG. 3), and an enlarged steering lower column tube 20 is secured to the lower portion of the steering column tube 18. The steering shaft 12 is inserted into the inside of the steering column tube 18. The upper end of the steering shaft 12 is connected with the steering wheel 10. The lower part of the steering shaft 12 extends into the inside of the enlarged lower column tube 20. The lower end of the steering shaft 12 is fixed by welding to a shaft portion 22 of a yoke 24. A lower bearing 26 is provided on the outer periphery of the shaft portion 22 of the yoke 24. The lower bearing 26 is secured through a retainer 28 to the inner face of the steering lower column tube 20. A snap ring 30, provided on the outer periphery of the shaft portion 22 of the yoke 24, prevents the lower bearing 26 from slipping out. A collar 32 fits onto the outer peripheral portion of the steering shaft 12 and is welded to the steering shaft 12. A holder 40 is press fitted onto the outer periphery of the collar 32. The holder 40 has a U-shaped cross-sectional shape. The holder 40 is to hold the disc 14 thereon. FIGS. 5 through 8 illustrate the detailed structure of the holder 40. The holder 40 has side walls 402 and 404, and a tubular portion 406 which connects with the side walls 402 and 404 at the opposite separate points thereof. The disc 14 is secured to a central point on an outer surface 408 of the tubular portion 406. The disc 14, as shown in FIG. 4, includes a number of small holes 50, which are substantially similar in shape and provided on the concentric points of the disc 14 at regular intervals. The enlarged lower column tube 20 has an aperture 52 at a position facing toward the holder 40. The aperture 52 is the shape of a square. The lower part of the sensor 16 extends through the aperture 52 into the inside of the enlarged lower column tube 20. The sensor 16 is fastened through screws 54 to a sensor mounting bracket 70. The bracket 70 is fixed to the enlarged lower column tube 20, as shown in FIG. 4.

Figure 6:
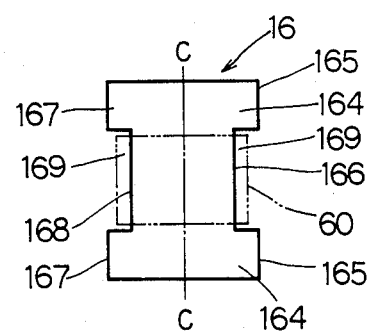
FIG. 6 is a cross-sectional view taken along the line VI—VI of FIG. 5.
Figures 7A, 7B, 7C, 7D:
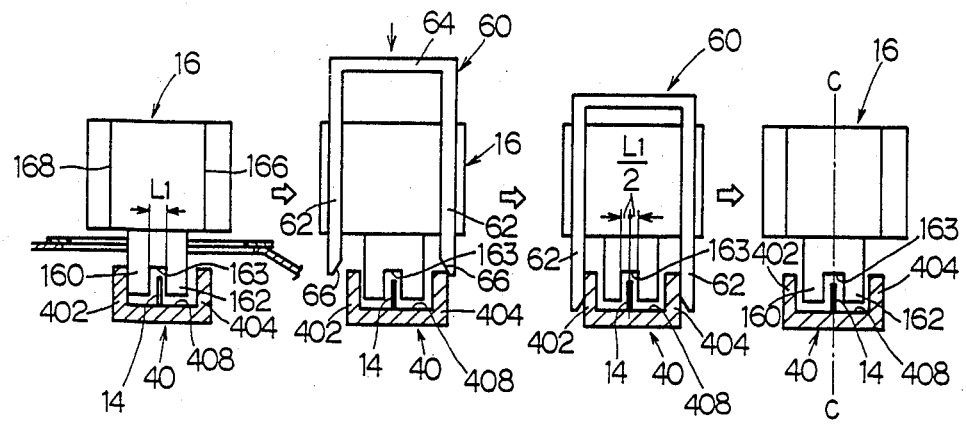
FIGS. 7(a), 7(b), 7(c) and 7(d) are views which illustrate assembling steps of the disc and the sensor according to the present invention.
Figure 8:
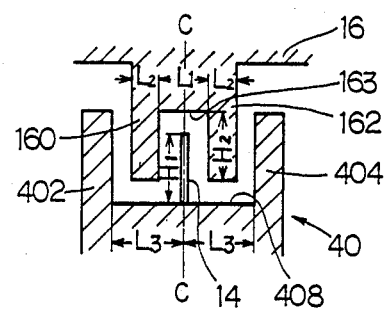
FIG. 8 is a cross-sectional view which illustrates the relationship between the sensor unit and the disc, according to the present invention.

The disc 14 is designed to have a shorter height "$H_1$" than that of the height "$H_2$" of the side walls 160 and 162, as shown in FIG. 8. The sensor 16 has a main portion 164 of a hexagonal cross-sectional shape, a luminescent element 160, and a light receiving element 162, both of which are secured to a bottom face of the main portion 164. The luminescent element 160 and a light receiving element 162 are separated from each other by the distance "$L_1$". The disc 14 is located on the central point of the distance "$L_1$". The sensor 16 has front side faces 165, a front intermediate side face 166, rear side faces 167, and a rear intermediate side face 168, as shown in FIG. 6. The sensor 16 is symmetrical about to the center line "C—C" shown in FIG. 6. The distance between the front intermediate side face 166 and the rear intermediate side face 168 is designed to be substantially same as that defined between the side walls 402 and 404 of the holder 40. The luminescent element 160 and the light receiving element 162 are provided at the symmetrical positions with regard to the center line "C—C" of the sensor 16 shown in FIG. 7(d). The luminescent element 160 is designed to have the same thickness as that of the light receiving element 162. There is provided a groove whose distance is "$L_1$" between the luminescent element 160 and the light receiving element 162.

The numeral 60 shown in FIGS. 6 and 7 designates a jig for avoiding contact of the thin disc 14 with the luminescent element 160 or the light receiving element 162 during assembly of the sensor 16 in the correct position. The jig 60 has a pair of legs 62, and a bridge portion 64. The pair of legs 62 extend parallel to each other. The bridge portion 64 connects one of the legs 62 with another. The jig 60 has a cross-sectional shape of a U. The distance between the inner faces of the legs 62 is designed to be same as that defined between the front intermediate side face 166 and the rear intermediate side face 168 of the holder 40. As the distance between the front intermediate side face 166 and the rear intermediate side face 168 of the holder 40 is designed to be same as that defined between the outer faces of the side walls 402 and 404, the distance between the inner faces of the legs 62 is designed to be same as that defined between the outer faces of the side walls 402 and 404. Each of the legs 62 has an inclined tip end 66, and each of the tip ends is oppositely inclined. Each of the legs 62 of the jig 60 is fitted onto the outer face of the side walls 402 or 404 of the holder 40, thereby the jig 60 tightly holds the holder 40.

The references as to the length of the sensor 16 and the holder 40 are shown in FIG. 8. The reference, $L_1$ is the distance between the luminescent element 160 and the light receiving element 162. The reference, $L_2$ is the thickness of the luminescent element 160 and the light receiving element 162. The reference $L_3$ is the distance between the disc 14 and the side walls 402, 404 of the holder 40. The height of the disc 14 is indicated by the reference "$H_1$". The luminescent element 160 and the light receiving element 162 project toward the holder 40 by the distance, "$H_2$". The embodiment according to the present invention has the following relation:

$$L_1 + L_2 > L_3 \tag{1}$$

$$H_2 > H_1 \tag{2}$$

The design characteristics shown by equation (1), provide for the following advantages: when the outer face of the luminescent element 160 contacts with the inner face of the side wall 402 as shown in FIG. 7(a), the light receiving element 162 does not contact the disc 14. Further, when the outer face of the light receiving element 162 contacts with the inner face of the side wall 404, the luminescent element 160 is not forced to contact with the disc 14.

The design characteristics shown by equation (2), even when the lower ends of the luminescent element 160 and the light receiving element 162 contact with the outer surface 408 of the holder 40, the top end of the disc 14 does not contact with a lower face 163 of the sensor 16.

The sensor 16 is assembled onto the steering column by the following procedure:

The sensor 16 is held in a condition that the luminescent element 160 contacts with the inner face of the side wall 402 of the holder 40, as shown in FIG. 7(a). Next, the jig 60 is inserted from the top onto the sensor 16, and the legs 62 of the jig 60 fit into grooves 169 defined in the sensor 16 shown in FIG. 6. One of the inclined top portions 66 of the legs 62 contacts with the outer periphery of the top end of the holder 40 as shown in FIG. 7(b). Then, both legs 62 are forced to move downward while keeping the contact with the outer surface of the side walls 402 and 404. The center line "C—C" of the sensor 16 becomes coincident with the plane of the disc 14. The sensor 16 is fastened through the sensor bracket 70 to the lower column tube 20 by screws 54 as shown in FIG. 4. Finally, the jig 60 is removed from the sensor 16.

When the sensor 16 is assembled one the steering column, the disc 14 is not forced to contact with the luminescent element 160 and the light receiving element 162. Hence, the disc 14 is not bent during the assembly. The sensor 16 can thus detect with accuracy the steering angle and the steering angular velocity. Workers can promptly assemble the sensor into the steering column by the use of the jig 60. Further, the jig 60 can protect the disc from being bent by the contact with the luminescent element or the light receiving element when the steering column is transferred.

While the present invention has been described in its preferred embodiment, it is to be understood that the invention is not limited thereto, and may be otherwise embodied within the scope of the following claims.

What is claimed is:

1. An apparatus for detecting an angle and an angular velocity of a rotating member, comprising:
a holder member circumferentially secured onto an outer peripheral portion of the rotating member, the holder member including a first radial projection and a second radial projection, said second radial projection being parallel to said first radial projection, a first interval being defined between said first radial and said second radial projections;

a disc mounted on and rotatable with the holder member, the disc having a plurality of holes equidistant and concentrically located from the center of the disc and the disc extending radially outward from the rotating member, the disc being centrally located between the first and second radial projections of the holder member, whereby a lower half interval is defined between the first radial projection and the disc, and an upper half interval is defined between the second radial projection and the disc;

a fixed member that does not rotate with the rotating member; and a sensor mounted on the fixed member and having a first extending portion housing a luminescent means and a second extending portion housing a light receiving means, said first extending portion and said second extending portion located on axially opposite sides of said disc, said first extending portion and said second extending portion being radially longer than said disc extending radially outward and said luminescent means and said light receiving means are axially aligned through said disc, said first and second extending portions being inserted respectively into the lower and upper half intervals with clearances being defined between the disc and the first and second radial projections, said first extending portion having a lower surface and an upper surface with the upper surface being closer to said disc than the lower surface, said second extending portion having a lower and upper surface with the lower surface being closer to the disc than the upper surface, a length defined between the lower surfaces of the first and second extending portions of the sensor which is greater than the upper half interval and a length being defined between the upper surfaces of the first and second extending portions of the sensor which is greater than the lower half interval, whereby when the first or second extending portions of the sensor are in contact with the first or second radial projections of the holder member, the first or second extending portions of the sensor do not contact the disc.

2. The apparatus of claim 1, wherein the holder member has a first axial end and a second axial end, the disc being centrally located between the first axial end and the second axial end.

3. The apparatus of claim 2, wherein the holder member comprises:

an annular portion extending between the first radial projection and the second radial projection, the annular portion having an axial width defined as "$2L_3$" and the disc being centrally secured between the first radial projection and the second radial projection at a position defined as "$L_3$", the annular portion contacting an outer peripheral portion of the rotating member and extending in the same direction as the rotating member, the first and second radial projections being connected to and extending perpendicularly from the annular portion of the holder member.

4. The apparatus of claim 3, wherein the first extending portion and the second extending portion each have an axial width defined as "$L_2$" and a distance between axially inner faces of the first extending portion and the second extending portion is defined as "$L_1$", and when the distance between axially inner faces ($L_1$) is added to the axial width of either the first extending portion or the second extending portion ($L_2$) the sum is greater than the axial width ($L_3$) of the annular portion of the holder ($L_1+L_2>L_3$).

5. The apparatus of claim 1, further comprising a jig securing the sensor to the holder member, the jig including a pair of legs, the legs being respectively fixed to the first and second radial projections of the holder member.

6. An apparatus for detecting a steering angle and an angular velocity of a steering column mounted on a vehicle, comprising:

a steering wheel;

a steering shaft connected with the steering wheel at one end thereof;

a holder member circumferentially secured onto an outer peripheral portion of the steering shaft, the holder member including a first radial projection and a second radial projection, said first radial projection and said second radial projection being substantially parallel;

a disc mounted on and rotatable with the steering shaft, the disc having a plurality of holes equidistant and concentrically located from the center of the disc and the disc extending radially outward from the steering shaft, the disc being centrally located between the first radial projection and the second radial projection, whereby a lower half interval is defined between the first radial projection and the disc and an upper half interval is defined between the second radial projection and the disc;

a steering column tube which holds the steering shaft allowing for rotation of the steering shaft therein; and a sensor mounted on the steering column tube and having a first extending portion housing a luminescent means and a second extending portion housing a light receiving means, said first extending portion and said second extending portion located on axially opposite sides of said disc, said first extending portion and said second extending portion being radially longer than said disc extending radially outward and said luminescent means and said light receiving means are axially aligned through said disc, said first and second extending portions being inserted respectively into the lower and upper half intervals with clearances being defined between the disc and the first and second radial projections, said first extending portion having a lower surface and an upper surface with the upper surface being closer to said disc than the lower surface, said second extending portion having a lower and an upper surface with the lower surface being closer to the disc than the upper surface, a length being defined between the lower surfaces of the first and second extending portions of the sensor being greater than the upper half interval and a length being defined between the upper surfaces of the first and second extending portions of the sensor which is greater than the lower half interval, whereby when the first or second extending portions of the sensor are in contact with the first or second radial projections of the holder member, the first or second extending portions of the sensor do not contact the disc; and a jig securing the sensor to the holder member, the jig including a pair of legs, the legs being respectively fixed to said first and second radial projections of the holder member.

7. The apparatus of claim 6, wherein the holder member has a first axial end and a second axial end, the disc being centrally located between the first axial end and the second axial end.

8. The apparatus of claim 7, wherein the holder member comprises:

an annular portion extending between the first radial projection and the second radial projection, the annular portion having an axial width defined as "$2L_3$" and the disc being centrally secured between the first radial projection and the second radial projection at a position defined as "$L_3$", the annular member portion contacting an outer peripheral portion of the steering shaft and extending in the same direction as the steering shaft and the first and second radial projections being connected to the annular portion and extend perpendicularly to the annular portion of the holder member.

9. The apparatus of claim 8, wherein the first extending portion and the second extending portion each have an axial width defined as "$L_2$" and a distance between axially inner faces of the first extending portion and the second extending portion is defined as "$L_1$", and when the distance between axially inner faces ($L_1$) is added to the axial width of either the first extending portion or the second extending portion ($L_2$) the sum is greater than the axial width ($L_3$) of the annular portion of the holder ($L_1 + L_2 > L_3$).

10. A method of assembling a sensor for detecting a rotation angle and an angular velocity of a rotating member into a position adjacent to a disc fixed on and rotatable with the rotating member, comprising the steps of:

contacting an outer surface of one of two radially extending portions of the sensor with an inner surface of one of two radially extending side walls of a holder mounted on the rotating member, with the disc located axially between inner surfaces of the extending portions of the sensor in a non-contacting manner;

fitting a jig having a pair of legs with inner surfaces separated by a distance equal to an axial width of the holder member onto outer surfaces of the sensor;

moving the sensor fitted with the jig toward the holder;

fixing the sensor to a sensor bracket; and removing the jig after the sensor is fixed to the sensor bracket.

* * * * *